United States Patent
Kang

(10) Patent No.: US 10,944,071 B2
(45) Date of Patent: Mar. 9, 2021

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventor: Tae-Wook Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/241,411

(22) Filed: Jan. 7, 2019

(65) Prior Publication Data
US 2019/0157610 A1 May 23, 2019

Related U.S. Application Data

(62) Division of application No. 14/312,906, filed on Jun. 24, 2014, now Pat. No. 10,243,167.

(30) Foreign Application Priority Data

Aug. 14, 2013 (KR) .................. 10-2013-0096887

(51) Int. Cl.
- *H01L 51/52* (2006.01)
- *H01L 51/56* (2006.01)
- *H01L 27/32* (2006.01)

(52) U.S. Cl.
CPC ...... *H01L 51/5246* (2013.01); *H01L 51/5206* (2013.01); *H01L 51/5209* (2013.01);
(Continued)

(58) Field of Classification Search
CPC . H01L 51/5246; H01L 51/5206; H01L 51/56; H01L 51/5221; H01L 51/5259;
(Continued)

(56) References Cited

U.S. PATENT DOCUMENTS 6,528,942 B1 * 3/2003 Tada ............... H01L 51/5012
313/503
7,663,313 B2 2/2010 Park
(Continued)

FOREIGN PATENT DOCUMENTS

| CN | 1592508 | 3/2005 |
| CN | 102569664 | 7/2012 |

(Continued)

OTHER PUBLICATIONS

Extended European Search Report dated Dec. 18, 2014, in European Patent Application No. 14180658.8.
(Continued)

*Primary Examiner* — Cuong B Nguyen
*Assistant Examiner* — Juanita B Rhodes
(74) *Attorney, Agent, or Firm* — H.C. Park & Associates, PLC

(57) ABSTRACT

A an organic light-emitting display apparatus, including a first substrate, a display unit having a plurality of organic light-emitting devices that is formed on the first substrate, a second substrate disposed on the display unit, and a filler included between the first substrate and the second substrate. The organic light-emitting device includes a first electrode formed on the first substrate, an intermediate layer that is disposed on the first electrode and includes an organic emission layer, and a porous second electrode disposed on the intermediate layer.

15 Claims, 4 Drawing Sheets

(52) U.S. Cl.
CPC ...... *H01L 51/5221* (2013.01); *H01L 51/5225* (2013.01); *H01L 51/5259* (2013.01); *H01L 51/56* (2013.01); *H01L 27/322* (2013.01); *H01L 2227/323* (2013.01)

(58) Field of Classification Search
CPC ............. H01L 51/5209; H01L 51/5225; H01L 2227/323; H01L 27/322; H05B 33/04
See application file for complete search history.

(56) References Cited

U.S. PATENT DOCUMENTS

| | | | |
|---|---|---|---|
| 8,803,138 B2 | 8/2014 | Fujita et al. | |
| 9,112,179 B2 | 8/2015 | Park et al. | |
| 9,123,670 B2 | 9/2015 | Kim et al. | |
| 2003/0062186 A1* | 4/2003 | Boroson | H01L 51/5275 313/512 |
| 2003/0230976 A1* | 12/2003 | Nishikawa | H01L 27/323 345/173 |
| 2004/0183433 A1* | 9/2004 | Cho | H01L 51/5262 313/504 |
| 2006/0022191 A1 | 2/2006 | Bakkers et al. | |
| 2006/0113907 A1* | 6/2006 | Im | H01L 51/5275 313/512 |
| 2009/0072733 A1 | 3/2009 | Funayama et al. | |
| 2009/0302747 A1 | 12/2009 | Kwack et al. | |
| 2010/0159792 A1 | 6/2010 | Visser et al. | |
| 2010/0244057 A1* | 9/2010 | Ryu | H01L 51/5246 257/88 |
| 2010/0308307 A1* | 12/2010 | Meerholz | H01L 51/5275 257/40 |
| 2010/0328282 A1* | 12/2010 | Su | H01L 27/322 345/206 |
| 2011/0050604 A1* | 3/2011 | Kwon | G06F 3/0445 345/173 |
| 2012/0132916 A1 | 5/2012 | Jung | |
| 2012/0153308 A1 | 6/2012 | Oh et al. | |
| 2012/0161141 A1* | 6/2012 | Jeon | H01L 27/322 257/59 |
| 2012/0206675 A1* | 8/2012 | Seo | H01L 51/5265 349/96 |
| 2012/0235137 A1* | 9/2012 | Koezuka | H01L 27/1052 257/43 |
| 2012/0235171 A1 | 9/2012 | Kim et al. | |
| 2013/0048995 A1 | 2/2013 | Yamazaki et al. | |
| 2013/0181602 A1 | 6/2013 | Kang et al. | |
| 2014/0225093 A1 | 8/2014 | Mackenzie | |
| 2014/0246665 A1* | 9/2014 | Lang | H01L 51/56 257/40 |
| 2014/0311668 A1 | 10/2014 | Yanagi | |
| 2015/0207100 A1 | 7/2015 | Saito et al. | |

FOREIGN PATENT DOCUMENTS

| | | |
|---|---|---|
| CN | 102683381 | 9/2012 |
| CN | 101847650 | 11/2012 |
| DE | 10-2011-084-276 | 4/2013 |
| JP | 2010-238479 | 10/2010 |
| JP | 2012-182127 | 9/2012 |
| JP | 2013-065549 | 4/2013 |
| JP | 2013-140839 | 7/2013 |
| JP | 2013-145754 | 7/2013 |
| KR | 10-2011-0061118 | 6/2011 |
| KR | 10-2012-0067730 | 6/2012 |
| KR | 10-2013-0084127 | 7/2013 |
| TW | 2013036480 | 10/2010 |
| TW | 201244023 | 11/2012 |
| WO | 2010/113727 | 10/2010 |
| WO | 2013/033035 | 3/2013 |
| WO | 2013053805 | 4/2013 |
| WO | 2013/073067 | 5/2013 |

OTHER PUBLICATIONS

Non-Final Office Action dated Sep. 29, 2015, in U.S. Appl. No. 14/312,906.
Final Office Action dated Mar. 7, 2016, in U.S. Appl. No. 14/132,906.
Non-Final Office Action dated Jul. 6, 2016, in U.S. Appl. No. 14/132,906.
Non-Final Office Action dated Feb. 2, 2017, in U.S. Appl. No. 14/132,906.
Final Office Action dated Jun. 2, 2017, in U.S. Appl. No. 14/132,906.
Non-Final Office Action dated Sep. 29, 2017, in U.S. Appl. No. 14/132,906.
Final Office Action dated Apr. 19, 2018, in U.S. Appl. No. 14/132,906.
Notice of Allowance dated Oct. 5, 2018, in U.S. Appl. No. 14/132,906.
Japanese Office Action dated Jan. 29, 2019, issued in Japanese Patent Application No. 2014-164878.
Non-Final Office Action dated Aug. 26, 2019 in the Korean Patent Application No. 10-2013-0096887.
Lucas, "Size Effect in Transfer of Nonpolar Solutes from Gas or Solvent to Another Solvent with a View on Hydrophobic Behavior," The Journal of Physical Chemistry, vol. 80, No. 4, pp. 359-362.

* cited by examiner

ORGANIC LIGHT-EMITTING DISPLAY APPARATUS AND METHOD OF MANUFACTURING THE SAME

CROSS REFERENCE TO RELATED APPLICATION

This application is a Divisional of U.S. patent application Ser. No. 14/312,906, filed on Jun. 24, 2014, and claims priority from and the benefit of Korean Patent Application No. 10-2013-0096887, filed on Aug. 14, 2013, in the Korean Intellectual Property Office, the disclosures of which are incorporated herein in its entirety by reference.

BACKGROUND

Field

One or more embodiments of the present invention relate to an organic light-emitting display apparatus and a method of manufacturing the same.

Discussion of the Background

Organic light-emitting display apparatuses using an organic light-emitting device are widely accepted as a next generation display apparatus due to their fast response speeds that enable the display of videos and their self-emitting characteristics that provide wide viewing angles and high brightness in comparison to liquid crystal displays (LCDs) that are now widely commercially available.

The organic light-emitting device includes a pixel electrode and a counter electrode that are face each other, and a light-emitting layer including an organic material that is disposed between the pixel electrode and the counter electrode. Since the organic light-emitting device is very sensitive to moisture, oxygen, or light, the deterioration of the organic light-emitting device may be facilitated when in contact therewith. Also, when oxygen or moisture diffuses into the organic layer, an electrochemical charge transfer reaction occurs at an interface between the electrode and the organic layer to generate an oxide. The oxide separates the organic layer and the pixel electrode or the counter electrode to cause a phenomenon, such as a dark spot. Thus, the lifetime of the organic light-emitting device may be reduced. Since the organic light-emitting device has weak heat resistance, it is known that the lifetime of the organic light-emitting device is reduced by about 20 times when the temperature increases to about 30° C. to about 60° C.

SUMMARY

One or more embodiments of the present invention include an organic light-emitting display apparatus that may improve the lifetime thereof by delaying the manifestation of progressive dark spots, and a method of manufacturing the same.

Additional aspects will be set forth in part in the description which follows and, in part, will be apparent from the description, or may be learned by practice of the presented embodiments.

According to one or more embodiments of the present invention, an organic light-emitting display apparatus includes: a first substrate; a display unit disposed on the first substrate and comprising organic light-emitting devices; a second substrate facing the first substrate; and a filler disposed between the first substrate and the second substrate. The organic light-emitting device includes a first electrode formed on the first substrate, an intermediate layer that is disposed on the first electrode and that includes an organic emission layer, and a porous second electrode disposed on the intermediate layer. Pores of the porous second electrode prevent localized concentration of impurities in the porous second electrode.

According to one or more embodiments of the present invention, an organic light-emitting display apparatus includes: a first substrate; a display unit disposed on the first substrate and comprising organic light-emitting devices; a second substrate facing the first substrate; and a color filter disposed on the second substrate. The organic light-emitting device includes a first electrode disposed on the first substrate, an intermediate layer that is disposed on the first electrode and includes an organic emission layer, and a porous second electrode disposed on the intermediate layer. Pores of the porous second electrode prevent a localized concentration of impurities in the porous second electrode.

According to one or more embodiments of the present invention, a method of manufacturing an organic light-emitting display apparatus includes: forming a display unit on a first substrate; forming a filler on the display unit; and disposing a second substrate on the filler. The forming of the display unit on the first substrate includes: forming a first electrode on the first substrate; forming an organic emission layer on the first electrode; and forming a porous second electrode on the organic emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION

Figure 1:
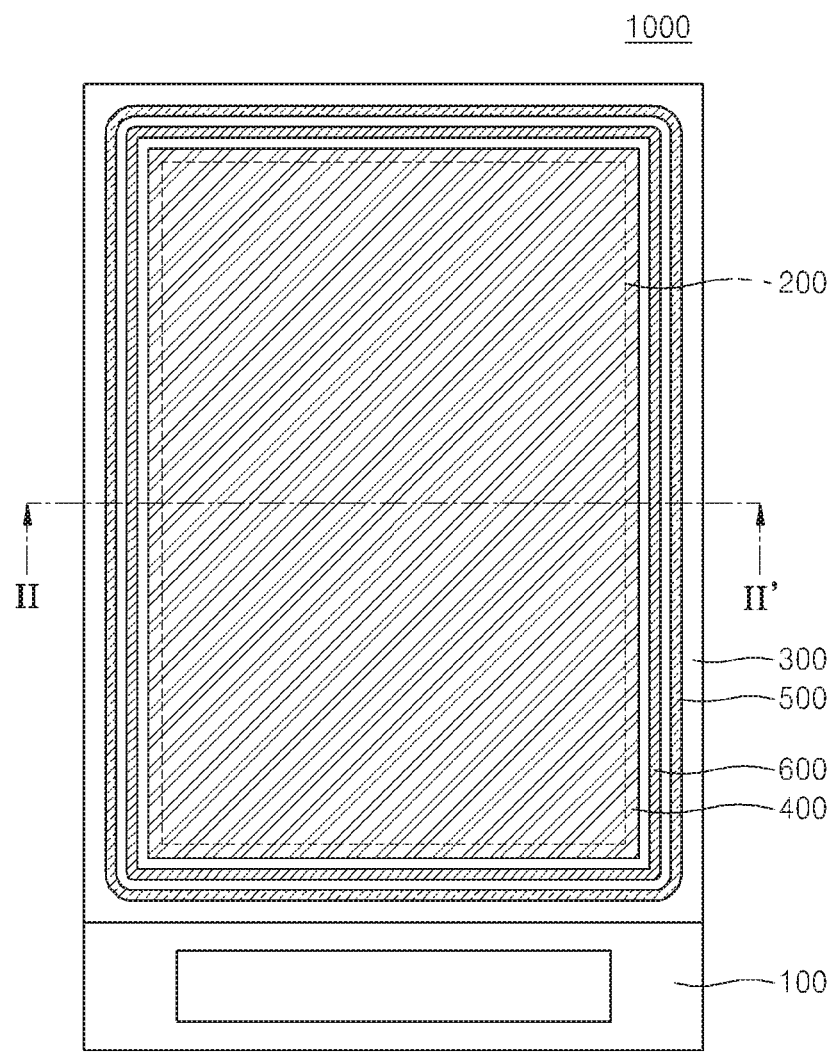
FIG. 1 is a plan view illustrating an organic light-emitting display apparatus according to a first embodiment of the present invention.

Reference will now be made in detail to exemplary embodiments of the present disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims. Moreover, detailed descriptions related to well-known functions or configurations will be ruled out in order not to unnecessarily obscure subject matters of the present invention.

It will be understood that although the terms "first", "second", etc. may be used herein to describe various components, these components should not be limited by these terms. These components are only used to distinguish one component from another.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Hereinafter, embodiments of the present invention will be described in detail with reference to the attached drawings. Like reference numerals in the drawings denote like elements, and thus their description will be omitted. In the drawings, the thicknesses of layers and regions may be scaled up for clarity of illustration. Also, in the drawings, the thicknesses of some layers and regions may be exaggerated for convenience of explanation.

As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
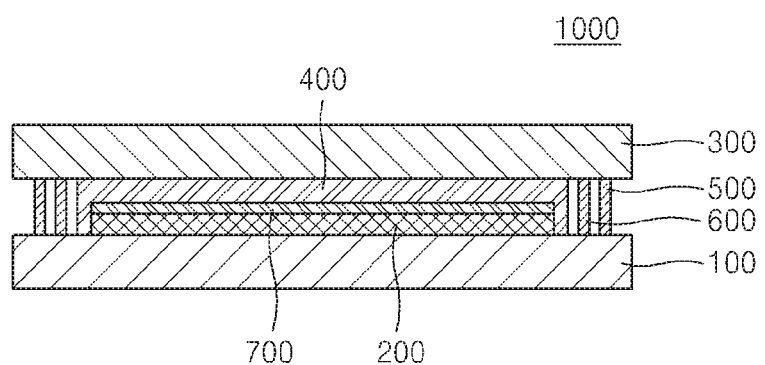
FIG. 2 is a cross-sectional view taken along line II-II' of FIG. 1.

FIG. 1 is a plan view illustrating an organic light-emitting display apparatus 1000 according to a first embodiment of the present invention. FIG. 2 is a cross-sectional view taken along line II-II' of FIG. 1.

As illustrated in FIGS. 1 and 2, the organic light-emitting display apparatus 1000 includes a first substrate 100, a display unit 200, a second substrate 300, a filler 400, a sealant 500, a getter 600, and a porous separation layer 700.

The first substrate 100 and the second substrate 300 may be formed of a transparent glass material including $SiO_2$ as a main component. However, the first substrate 100 and the second substrate 300 are not necessarily limited thereto, and the first substrate 100 and the second substrate 300 may be formed of a transparent plastic material, a barrier film, or a metal. The barrier film may be a multilayer composite of an organic layer and an inorganic layer. The plastic material constituting the first substrate 100 or the second substrate 300 may be an insulating organic material. The plastic material may be an organic material, such as at least one of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), triacetyl cellulose (TAC), and cellulose acetate propionate (CAP). In a case where the first substrate 100 or the second substrate 300 are formed of the plastic material, a barrier layer or a barrier film may be further included on or under the substrate(s).

In a case where the organic light-emitting display apparatus 1000 is a bottom-emission type, in which an image is formed in a direction of the first substrate 100, the first substrate 100 may be formed of a transparent material, and the second substrate 300 may be formed of a transparent or non-transparent material. In this case, the second substrate 300 may be formed of a metal. In contrast, in a case where the organic light-emitting display apparatus 1000 is a top-emission type, in which an image is formed in a direction of the second substrate 300, the second substrate 300 may be formed of a transparent material, and the first substrate 100 may be formed of a transparent material or a non-transparent material. In this case, the first substrate 100 may be formed of a metal. In the case where the first substrate 100 or the second substrate 300 is formed of the metal, the first substrate 100 or the second substrate 300 may include at least one of carbon, iron, chromium, manganese, nickel, titanium, molybdenum, stainless steel (SUS), an Invar alloy, an Inconel alloy, and a Kovar alloy. However, the present invention is not limited thereto. The first substrate 100 or the second substrate 300 may be formed of a metal foil. The organic light-emitting display apparatus 1000 may be a dual-emission type in which light is emitted in both top and bottom directions.

Figure 3:
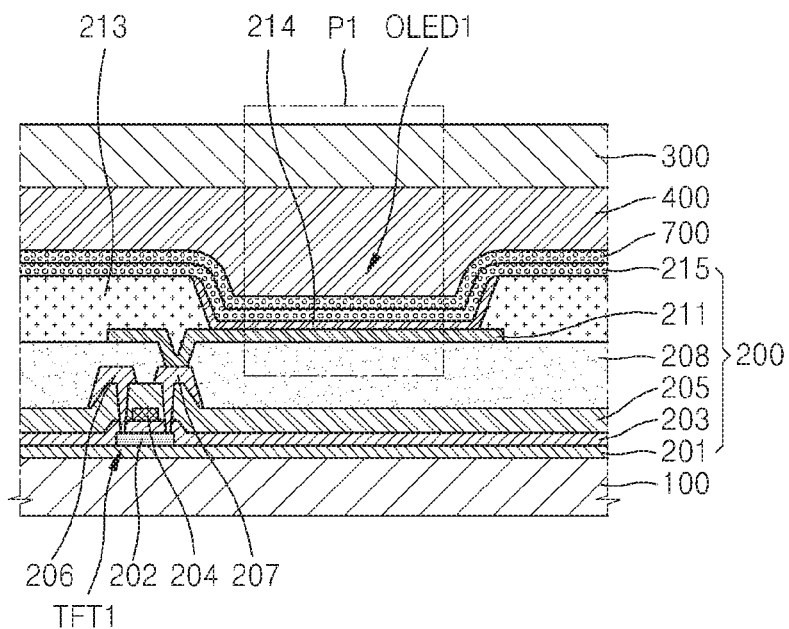
FIG. 3 is a layout drawing illustrating a structure of a pixel of the organic light-emitting display apparatus of FIG. 1.

The display unit 200 defines an active area on the first substrate 100 and includes, as shown in FIG. 3, for example, a thin film transistor TFT1 and an organic light-emitting device OLED1 that are electrically connected to each other. A pad unit (not shown) is disposed around the active area, and thus, an electrical signal from a power supply (not shown) or a signal generator (not shown) may be transferred to the active area.

The filler 400 is included between the first substrate 100 and the second substrate 300, and more particularly, the filler 400 is included to fill a space between the first substrate 100 and the second substrate 300. Since the filler 400 is included between the first substrate 100 and the second substrate 300, the structure of the organic light-emitting display apparatus 1000 may be maintained, and a delamination or cell breakage phenomenon, due to an external impact, may be prevented. An organic material, an organic/inorganic composite material, or a mixture thereof may be used as the filler 400.

The organic material may be at least one of an acryl-based resin, a methacryl-based resin, a polyisoprene, a vinyl-based resin, an epoxy-based resin, a urethane-based resin, and a cellulose-based resin. Examples of the acryl-based resin may be butyl acrylate and ethylhexyl acrylate. Examples of the methacryl-based resin include propylene glycol methacrylate, and tetrahydrofurfuryl methacrylate. Examples of the vinyl-based resin include vinyl acetate and N-vinylpyrrolidone. Examples of the epoxy-based resin include cycloaliphatic epoxide. Examples of the urethane-based resin may be urethane acrylate. Examples of the cellulose-based resin include cellulose nitrate.

The organic/inorganic composite material is a material in which a metal, such as silicon, aluminum, titanium, or zirconium, a non-metallic material, and an organic material are covalently bonded. For example, the organic/inorganic composite material may include at least one of an epoxy silane or a derivative thereof, a vinyl silane or a derivative thereof, an amine silane or a derivative thereof, a methacrylate silane or a derivative thereof, or a partially cured product thereof. Examples of the epoxy silane or a derivative thereof include 3-glycidoxypropyltrimethoxysilane and a polymer thereof. Examples of the vinyl silane or a derivative thereof include vinyltriethoxysilane and a polymer thereof. Examples of the amine silane or a derivative thereof may be 3-aminopropyltriethoxysilane and a polymer thereof. Examples of the methacrylate silane or a derivative thereof include 3-(trimethoxysilyl)propyl acrylate and a polymer thereof.

Since the filler 400 may include an organic material, outgas may be released from the filler 400. Herein, the outgas denotes a source gas that is diffused from the filler 400.

A getter material, which may absorb the outgas from the filler 400, may be included in the filler 400. The getter material may reduce an amount of an outgas material in the filler 400 by absorbing the outgas. As a result, deterioration of an organic emission layer, due to the diffusion of the outgas thereinto, may be prevented.

The sealant 500 is disposed between the first substrate 100 and the second substrate 300, surrounds the display unit 200 while having a predetermined spacing therefrom. The sealant 500 is disposed along edges of the first substrate 100 and the second substrate 300 to bond and seal the first substrate 100 and the second substrate 300 together. The sealant 500 includes an organic material that includes an epoxy including a photocurable material, acryl, and silicon, or includes an organic-inorganic material including talc, calcium oxide (CaO), barium oxide (BaO), zeolite, and silicon oxide (SiO). The sealant 500 may be cured by light, such as ultraviolet (UV) light. Also, a glass frit may be used as the sealant 500.

The getter 600 may be disposed between the display unit 200 and the sealant 500. The getter 600 has moisture absorption capacity and blocks moisture that may penetrate into the display unit 200 from the outside through the sealant 500. That is, the moisture that may penetrate into the display unit 200 from the outside is blocked by the getter 600. Thus, the getter 600 may operate to increase the lifetime of the display unit 200.

Figure 4:
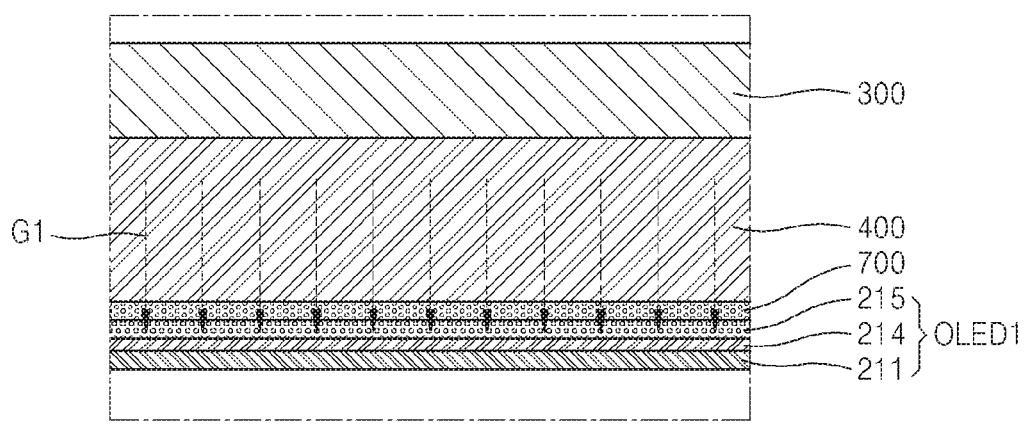
FIG. 4 is an enlarged view of region "P1" of FIG. 3.

Hereinafter, an internal structure of the organic light-emitting display apparatus 1000 will be described in detail with reference to FIGS. 3 and 4. FIG. 3 is a layout drawing illustrating a structure of a pixel of the organic light-emitting display apparatus 1000. FIG. 4 is an enlarged view of region "P1" of FIG. 3.

Referring to FIG. 3, a buffer layer 201 may be formed on the first substrate 100. The buffer layer 201 is formed on an entire surface of the first substrate 100, i.e., both of the active area and the outside of the active area. The buffer layer 201 prevents the penetration of impurity elements into the first substrate 100 and provides a flat surface on the first substrate 100. The buffer layer 201 may be formed of various materials that can perform the above operations.

For example, the buffer layer 201 may include an inorganic material, such as silicon oxide, silicon nitride, silicon oxynitride, aluminum oxide, aluminum nitride, titanium oxide, and titanium nitride. The buffer layer 201 may include an organic material, such as a polyimide, a polyester, and an acryl. The buffer layer 201 may include multiple layers formed of the aforementioned materials.

The TFT1 may be formed on the buffer layer 201. The TFT1 may include an active layer 202, a gate electrode 204, a source electrode 206, and a drain electrode 207. The active layer 202 may be formed of an inorganic semiconductor, such as amorphous silicon or polysilicon, an organic semiconductor, or an oxide semiconductor, and may include a source region, a drain region, and a channel region.

A gate dielectric layer 203 is formed on the active layer 202. The gate dielectric layer 203 is formed to correspond to the entire first substrate 100. That is, the gate dielectric layer 203 may cover both of the active area and the outside of the active area on the first substrate 100. The gate dielectric layer 203 insulates the gate electrode 204 from the active layer 202, and may be formed of an organic material or an inorganic material, such as $SiN_x$ and $SiO_2$.

The gate electrode 204 is formed on the gate dielectric layer 203. The gate electrode 204 may include gold (Au), silver (Ag), copper (Cu), nickel (Ni), platinum (Pt), palladium (Pd), aluminum (Al), and molybdenum (Mo). The gate electrode 204 may include an alloy, such as an Al: neodymium (Nd) alloy and a Mo: tungsten (W) alloy. However, the gate electrode 204 is not limited thereto, and may be formed of various materials in consideration of design conditions.

An interlayer dielectric 205 is formed on the gate electrode 204. The interlayer dielectric 205 may be formed to correspond to the entire surface of the first substrate 100. That is, the interlayer dielectric 205 may cover both of the active area and the outside of the active area.

The interlayer dielectric 205 is disposed between the gate electrode 204 and the source electrode 206 or the gate electrode 204 and the drain electrode 207 to insulate therebetween, and may be formed of an inorganic material, such as $SiN_x$ and $SiO_2$. The interlayer dielectric 205 may be formed of $SiN_x$, or may be formed of a double-layer structure of a $SiN_x$ layer and a $SiO_2$ layer.

The source electrode 206 and the drain electrode 207 may be formed on the interlayer dielectric 205. Specifically, the interlayer dielectric 205 and the gate dielectric layer 203 expose the source region and the drain region of the active layer 202, and the source electrode 206 and the drain electrode 207 respectively contact the exposed source region and drain region of the active layer 202.

Although FIG. 3 exemplifies a top-gate type TFT1 sequentially including the active layer 202, the gate electrode 204, and the source and drain electrodes 206 and 207, the present invention is not limited thereto. For example, the gate electrode 204 may be disposed under the active layer 202. The TFT1 drives the OLED1 by being electrically connected thereto, and is protected by being covered with a passivation layer 208.

An inorganic insulating layer and/or an organic insulating layer may be used as the passivation layer 208. The inorganic insulating layer may include at least one of $SiO_2$, $SiN_x$, SiON, $Al_2O_3$, $TiO_2$, $Ta_2O_5$, $HfO_2$, $ZrO_2$, barium strontium titanate (BST), and lead zirconium titanate (PZT). The organic insulating layer may include at least one of a general purpose polymer (e.g., poly(methyl methacrylate) (PMMA), or polystyrene (PS)), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, and a blend thereof. Also, the passivation layer 208 may be formed as a composite stack of the inorganic insulating layer and the organic insulating layer.

The OLED1 is formed on the passivation layer 208. The OLED1 may include a first electrode 211, an intermediate layer 214, and a porous second electrode 215. The first electrode 211 is formed on the passivation layer 208. Specifically, the passivation layer 208 does not cover the entire drain electrode 207 and exposes a predetermined region thereof. The first electrode 211 may be connected to the exposed drain electrode 207.

In the present embodiment, the first electrode 211 may be a reflective electrode. The first electrode 211 may include a reflective layer formed of at least one of Ag, magnesium (Mg), Al, Pt, Pd, Au, Ni, Nd, iridium (Ir), chromium (Cr), and a compound thereof, and a transparent or translucent electrode layer formed on the reflective layer. The transparent or translucent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The porous second electrode 215 faces the first electrode 211 and may be a transparent or translucent electrode. The porous second electrode 215 may be formed as a thin film of a metal with a low work function, such as at least one of lithium (Li), calcium (Ca), LiF/Ca, LiF/Al, Al, Ag, Mg, ytterbium (Yb), and a compound thereof. Also, an auxiliary electrode layer or a bus electrode may be further formed on the metallic thin film. The auxiliary electrode layer may be formed of a material for forming a transparent electrode, such as at least one of ITO, IZO, ZnO, and $In_2O_3$.

Therefore, the porous second electrode 215 may transmit light emitted from an organic emission layer included in the intermediate layer 214. That is, the light emitted from the organic emission layer may be emitted toward the porous second electrode 215 directly, or by being reflected by the reflective first electrode 211.

However, the organic light-emitting display apparatus 1000 is not limited to a top-emission type display apparatus. For example, the organic light-emitting display apparatus 1000 may be a bottom-emission type display apparatus in which the light emitted from the organic emission layer is emitted toward the first substrate 100. In this case, the first electrode 211 may be composed of a transparent or translucent electrode, and the porous second electrode 215 may be reflective. Also, the organic light-emitting display apparatus 1000 may be a dual-emission type in which light is emitted in both top and bottom directions.

The porous second electrode 215 includes pores that may be connected in a network. The pores may prevent the localized concentration of impurities in the porous second electrode 215. Herein, the localized concentration of impurities refers to the concentration of impurities in a particular portion of an element, such as the porous second electrode 215. In other words, the pores allow for the impurities to be regularly dispersed in the porous second electrode 215. The impurities may be, for example, moisture and/or oxygen derived from the filler 400, or moisture and/or oxygen introduced from the outside of the organic light-emitting display apparatus 1000. Thus, the porous second electrode 215 may delay the occurrence of dark spots that are generated due to the localized concentration of the impurities.

A pixel-defining layer 213 is formed of an insulating material on the first electrode 211. The pixel-defining layer 213 exposes a predetermined region of the first electrode 211. The intermediate layer 214, including the organic emission layer, is disposed on the exposed region of the first electrode 211. The pixel-defining layer 213 may be formed of one or more organic insulating materials selected from a polyimide, a polyamide, an acryl resin, a benzocyclobutane, and a phenol resin, by using a method such as spin coating. The pixel-defining layer 213 may be formed of at least one inorganic insulating materials selected from $SiO_2$, $SiN_x$, $Al_2O_3$, $CuO_x$, $Tb_4O_7$, $Y_2O_3$, $Nb_2O_5$, and $Pr_2O_3$. Also, the pixel-defining layer 213 may be formed in a multilayer structure, in which the organic insulating material and the inorganic insulating material are alternately stacked.

The organic emission layer may be formed of a low molecular weight organic material or a polymer organic material. When the organic emission layer is formed of a low molecular weight organic material, a hole transport layer and a hole injection layer are stacked in a direction of the first electrode 211, and an electron transport layer and an electron injection layer are stacked in a direction of the porous second electrode 215 centered on the organic emission layer in the intermediate layer 214. In addition, various layers may be stacked if necessary. In this case, the organic material may be at least one of copper phthalocyanine (CuPc), N,N'-di(naphthalene-1-yl)-N,N'-diphenyl-benzidine (NPB), and tris-8-hydroxyquinoline aluminum (Alq3).

When the organic emission layer is formed of a polymer organic material, only the hole transport layer may be included in the direction of the first electrode 211 centered on the organic emission layer in the intermediate layer 112. The hole transport layer may be formed on the first electrode 211 by inkjet printing or spin coating, using poly(3,4-ethylenedioxythiophene) (PEDOT) or polyaniline (PANT). In this case, a usable organic material may include a polymer organic material, such as at least one of a polyphenylene vinylene (PPV) based material and a polyfluorene based material. A color pattern may be formed by a typical method, such as inkjet printing, spin coating, or laser induced thermal imaging.

The filler 400 is included between the porous second electrode 215 and the second substrate 300. Since the filler 400 is included between the porous second electrode 215 and the second substrate 300, the structure of the organic light-emitting display apparatus 1000 may be maintained and the delamination or cell breakage phenomenon, due to external impact, may be prevented.

The porous separation layer 700 may be disposed between the filler 400 and the porous second electrode 215. In a case where the filler 400 is directly in contact with the porous second electrode 215, external impacts may be directly applied to the porous second electrode 215. This may be a cause of progressive dark spots, or the porous second electrode 215 may be detached. Also, in the case where the filler 400 is directly in contact with the porous second electrode 215, a chemical reaction between the filler 400 and the porous second electrode 215 may occur. Therefore, the porous separation layer 700, which may act as a sacrificial layer, is disposed between the filler 400 and the porous second electrode 215. Thus, limitations that may occur due to the direct contact between the filler 400 and the porous second electrode 215 may be prevented. Also, in the case where the organic light-emitting display apparatus 1000 is a top-emission type, the porous separation layer 700 may assist the emission of light generated by the OLED1, in addition to separating the filler 400 and the porous second electrode 215.

The porous separation layer 700 may include an organic material or lithium fluoride (LiF). The porous separation layer 700 may be formed of an organic material, such as at least one of N,N'-diphenyl-N,N'-bis(1-naphthyl)-1,1'biphenyl-4,4"diamine (α-NPD), NPB, N,N'-bis(3-methylphenyl)-N,N'-diphenyl-[1,1-biphenyl]-4,4'-diamine (TPD), 4,4',4"-tris-(3-methylphenylphenylamino)triphenylamine (m-MTDATA), Alq3, or CuPc.

The porous separation layer 700 includes pores that may be interconnected in a network. The porous separation layer 700 may prevent the localized concentration of impurities, such as external moisture and/or oxygen, or moisture and/or oxygen derived from the filler 400, which may affect the organic emission layer. In particular, the impurities may be regularly dispersed in the porous separation layer 700 via the pores, on a part of the inside of the porous second electrode 215. The porous separation layer 700 may delay the occurrence of dark spots that are generated due to the concentration of the impurities.

In the case where the organic light-emitting display apparatus 1000 is a top-emission type, a porous high refractive index layer (not shown), which may assist emission of the light generated by the OLED1, may be disposed between the porous separation layer 700 and the porous second electrode 215.

Referring FIG. 4, the first electrode 211, the intermediate layer 214, the porous second electrode 215, the porous separation layer 700, the filler 400, and the second substrate 300 are sequentially formed. The porous second electrode 215 may be formed by sputtering, atomic layer deposition (ALD), or chemical vapor deposition (CVD).

In the case where the organic light-emitting display apparatus 1000 is a top-emission type, the porous second electrode 215 may be naturally formed with a porous structure, by forming a metal layer having a thickness of about 1 Å to about 200 Å. In the case where the organic light-emitting display apparatus 1000 is a bottom-emission type, the porous second electrode 215 may be formed with a polycrystalline structure, by depositing a metal by metal organic chemical vapor deposition (MOCVD) and growing the deposited metal as grains. However, in the case where the organic light-emitting display apparatus 1000 is a top-emission type, the porous second electrode 215 may be formed to a thickness in which a reflectance is secured. A method of forming the porous second electrode 215 is not limited thereto, and the porous second electrode 215 may be formed by various other methods, in consideration of forming conditions.

Since the filler 400 may include an organic material, impurities may be generated from the filler 400. Specifically, outgas G1 may be released from the filler 400. Herein, the outgas denotes a source gas that is diffused from the filler 400. Since the porous second electrode 215 has a porous structure, a material damaging the porous second electrode 215 or the intermediate layer 214, such as the outgas G1 derived from the filler 400, may not be locally concentrated on a portion thereof, but may uniformly diffuse in the porous second electrode 215. In particular, the impurities may be regularly dispersed in the porous second electrode 215 via the pores. Since the concentration of the material damaging the porous second electrode 215 or the intermediate layer 214, such as the outgas G1 derived from the filler 400, on the portion may be prevented by an average effect, a local damage to the porous second electrode 215 or the intermediate layer 214 may be suppressed as much as possible. Thus, the manifestation of dark spots may be delayed. Herein, the expression "average effect" denotes an effect in which an outgas material is not concentrated on a portion, but diffuses regularly.

When a dense electrode is used instead of a porous electrode as a second electrode, the outgas material diffuses through defects of the dense second electrode, i.e., pinholes generated by foreign matter or scratches. Thus, the outgas material may be concentrated on the defects. As a result, an intermediate layer between the first electrode and the second electrode is damaged at the defects and generates dark spots. Thus, progressive dark spots may occur, which are dark spots that continuously grow. Since the porous electrode is used as the second electrode, the outgas material may not be locally concentrated on the defects, but may uniformly diffuse due to the average effect. Thus, the progressive dark spots may not be generated. As a result, the lifetime of the organic light-emitting display apparatus 1000 may be extended to improve the reliability of the product.

In order for the impurities, such as the outgas G1 derived from the filler 400, to uniformly diffuse in the porous second electrode 215, a pore diameter of the porous second electrode 215 may be about 3 Å or more. Since the diameter of a water molecule ($H_2O$) is about 2.65 Å and the diameter of an oxygen molecule ($O_2$) is about 3 Å, the pore diameter of the porous second electrode 215 is formed to be about 3 Å or more. Thus, the concentration of the impurities on the part of the porous second electrode 215 may be prevented, to delay the occurrence of dark spots that are generated due to the concentration of the impurities.

The pore diameter of the porous second electrode 215 may be about 200 Å or less.

The porous separation layer 700 may be disposed between the filler 400 and the porous second electrode 215. Since the porous separation layer 700 has a porous structure, the outgas G1 derived from the filler 400 may diffuse throughout the porous separation layer 700 without being locally concentrated on a particular portion thereof. In order for the impurities not to be locally concentrated, other additional layers disposed between the filler 400 and the porous second electrode 215 may also be porous.

Figure 5:
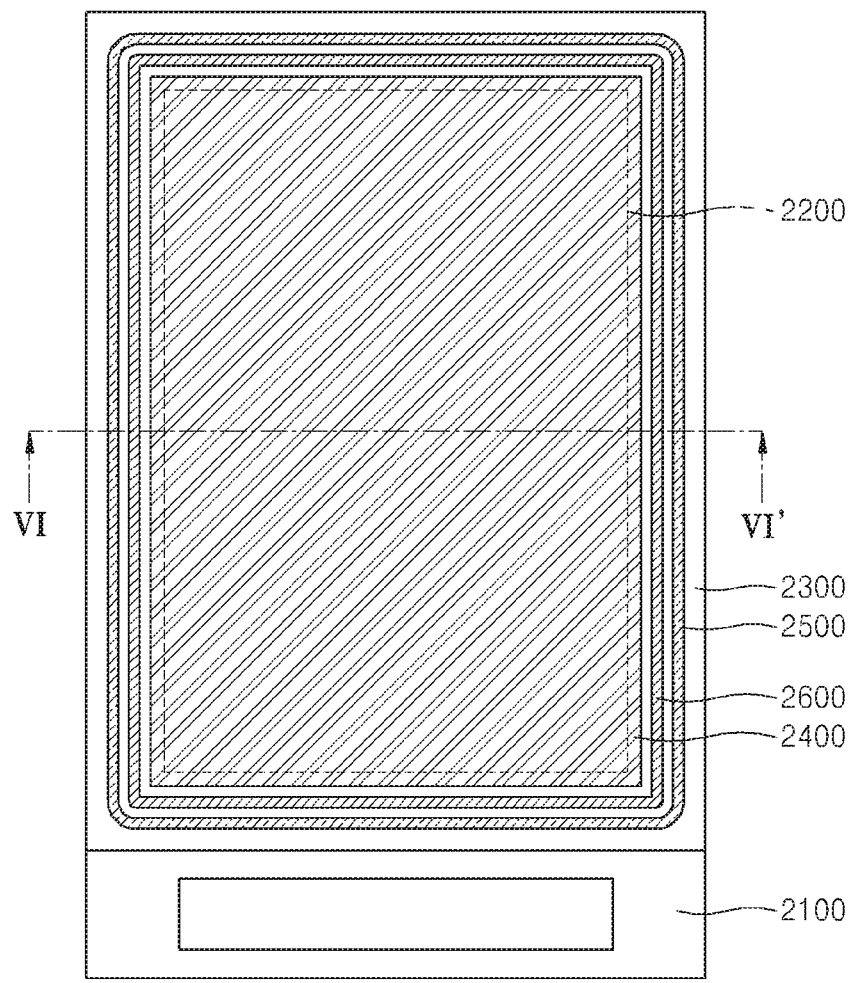
FIG. 5 is a plan view illustrating an organic light-emitting display apparatus according to an exemplary embodiment of the present invention.
Figure 6:
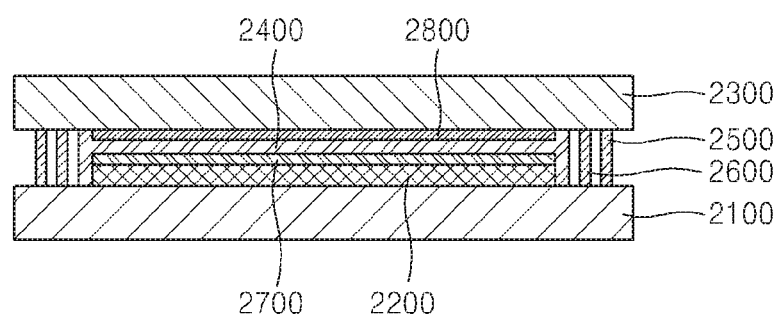
FIG. 6 is a cross-sectional view taken along line VI-VI' of FIG. 5.

FIG. 5 is a plan view illustrating an organic light-emitting display apparatus 2000 according to various embodiments of the present invention. FIG. 6 is a cross-sectional view taken along line VI-VI' of FIG. 5. Hereinafter, the present embodiment will be described by focusing on the differences between the organic light-emitting display apparatuses 1000 and 2000. As illustrated in FIGS. 5 and 6, the organic light-emitting display apparatus 2000 includes a first substrate 2100, a display unit 2200, a second substrate 2300, a filler 2400, a sealant 2500, a getter 2600, a porous separation layer 2700, and a color filter 2800.

The first substrate 2100 and the second substrate 2300 may be formed of a transparent glass material including $SiO_2$ as a main component. However, the first substrate 2100 and the second substrate 2300 are not limited thereto. For example, the first substrate 2100 and the second substrate 2300 may be formed of a transparent plastic material, a barrier film, or a metal.

The display unit 2200 defines an active area on the first substrate 2100 and includes a thin film transistor TFT2 and an organic light-emitting device OLED2 that are electrically connected to each other.

The filler 2400 is included between the first substrate 2100 and the second substrate 2300. The filler 2400 is included to fill a space between the first substrate 2100 and the second substrate 2300. An organic material, an organic/inorganic composite material, or a mixture thereof, may be used as the filler 2400. Since the filler 2400 may include an organic material, an outgas may be released from the filler 2400. Herein, the outgas denotes a source gas that is diffused from the filler 2400.

A getter material, which may absorb the outgas, may be included in the filler 2400. The getter material may reduce an amount of an outgas material released from the filler 2400 by absorbing the outgas material. As a result, deterioration of an organic emission layer due to the diffusion of the outgas thereinto may be prevented.

The sealant 2500 is disposed between the first substrate 2100 and the second substrate 2300, surrounds the display unit 2200, and is disposed at a predetermined distance therefrom. The sealant 2500 is disposed along edges of the first substrate 2100 and the second substrate 2300 to bond and seal the first substrate 2100 and the second substrate 2300 together.

The getter 2600 may be disposed between the display unit 2200 and the sealant 2500. The getter 2600 has moisture absorption capacity and operates to block moisture that may penetrate into the display unit 2200 from the outside, through the sealant 2500.

The color filter 2800 is disposed under the second substrate 2300. The p color filter 2800 may be formed under the second substrate 2300. The color filter 2800 may include a red color filter corresponding to a red pixel, a green color filter corresponding to a green pixel, and a blue color filter corresponding to a blue pixel. The color filter 2800 may be formed by patterning after coating. The color filter 2800 may be formed to a thickness ranging from about 1 μm to about 5 μm, in order to satisfy a target color coordinate. The color filter 2800 may be disposed as a color filter array (COA). The color filter 2800 may generate different colors by receiving white light.

Since the color filter 2800 may include an organic material, outgas may be released from the color filter 2800. Herein, the outgas denotes a source gas that is diffused from the color filter 2800.

Figure 7:
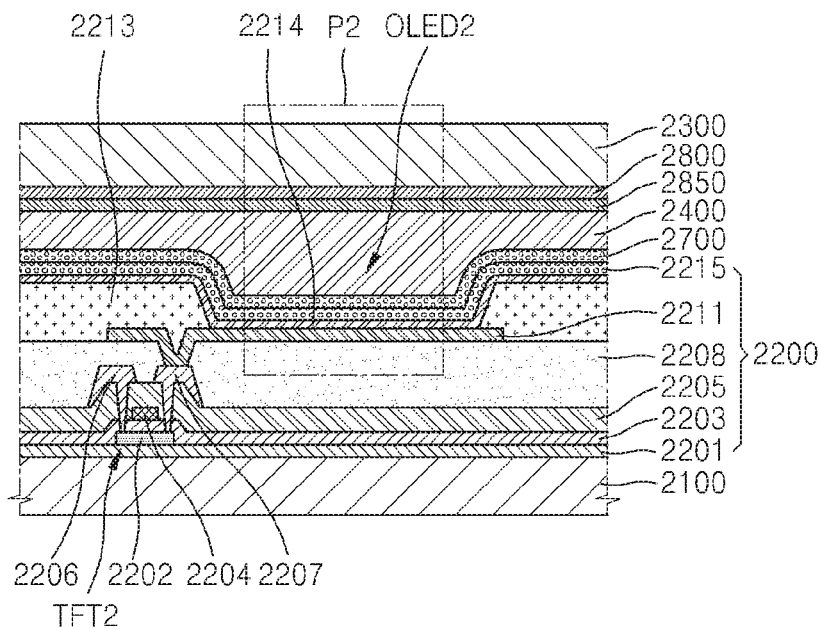
FIG. 7 is a layout drawing illustrating a structure of a pixel of the organic light-emitting display apparatus of FIG. 5.
Figure 8:
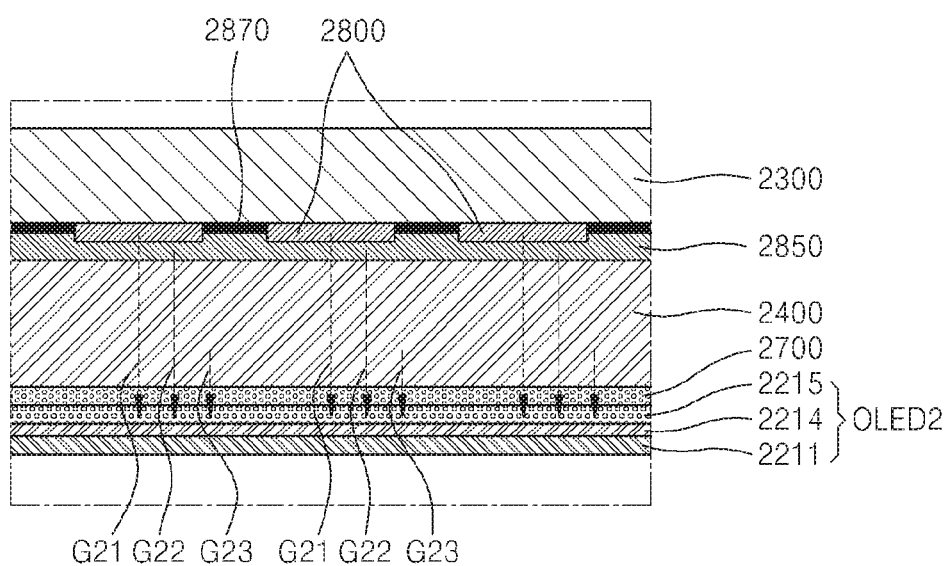
FIG. 8 is an enlarged view of region "P2" of FIG. 7.

Hereinafter, an internal structure of the organic light-emitting display apparatus 2000 will be described in detail with reference to FIGS. 7 and 8. FIG. 7 is a layout drawing illustrating a structure of a pixel of the organic light-emitting display apparatus 2000. FIG. 8 is an enlarged view of region "P2" of FIG. 7.

Referring to FIG. 7, a buffer layer 2201 may be formed on the first substrate 2100. The TFT2 may be formed on the buffer layer 2201. The TFT2 may include an active layer 2202, a gate electrode 2204, a source electrode 2206, and a drain electrode 2207.

A gate dielectric layer 2203 is formed on the active layer 2202. The gate electrode 2204 is formed on the gate dielectric layer 2203. An interlayer dielectric 2205 is formed on the gate electrode 2204. The source electrode 2206 and the drain electrode 2207 may be formed on the interlayer dielectric 2205.

Although FIG. 7 exemplifies a top-gate type TFT2, the present invention is not limited thereto. In particular, the gate electrode 2204 may be disposed under the active layer 2202.

The TFT2 drives the OLED2 by being electrically connected thereto, and is protected by being covered with a passivation layer 2208. The OLED2 is formed on the passivation layer 2208, and the OLED2 may include a first electrode 2211, an intermediate layer 2214, and a porous second electrode 2215.

The first electrode 2211 is formed on the passivation layer 2208. Specifically, the passivation layer 2208 exposes a predetermined region of the drain electrode 2207. The first electrode 2211 may be connected to the exposed drain electrode 2207.

The first electrode 2211 may be a reflective electrode. The porous second electrode 2215 faces the first electrode 2211 and may be a transparent or translucent electrode formed of a metallic thin film. Also, an auxiliary electrode layer or a bus electrode may be further formed of a material for forming a transparent electrode, such as ITO, IZO, ZnO, or $In_2O_3$, on the metallic thin film.

Therefore, the porous second electrode 2215 may transmit light emitted from an organic emission layer included in the intermediate layer 2214. That is, the light emitted from the organic emission layer may be emitted toward the porous second electrode 2215 directly, or by being reflected by the reflective first electrode 2211. However, the organic light-emitting display apparatus 2000 is not limited to a top-emission type display apparatus. For example, the organic light-emitting display apparatus 2000 may be a dual-emission type in which light is emitted in both top and bottom directions.

The porous second electrode 2215 has a porous structure. The porous second electrode 2215 may prevent the localized concentration of impurities therein, i.e., the impurities may be regularly dispersed in the porous second electrode 2215 via the pores thereof. The impurities may be, for example, moisture and/or oxygen derived from the color filter 2800, an overcoat layer 2850, or the filler 2400, or moisture and/or oxygen introduced from the outside of the organic light-emitting display apparatus 2000. Thus, the porous second electrode 2215 may delay the occurrence of dark spots that are generated due to the concentration of the impurities.

A planarization layer 2213 is formed of an insulating material on the first electrode 2211. The planarization layer 2213 exposes a predetermined region of the first electrode 2211. The intermediate layer 2214, including the organic emission layer, is disposed on the exposed region of the first electrode 211. The planarization layer 2213 may be formed of one or more organic insulating materials selected from a polyimide, a polyamide, an acryl resin, a benzocyclobutane, and a phenol resin, by using a method such as spin coating. The planarization layer 2213 may also be formed of an inorganic insulating material selected from $SiO_2$, $SiN_x$, $Al_2O_3$, $CuO_x$, $Tb_4O_7$, $Y_2O_3$, $Nb_2O_5$, and $Pr_2O_3$. Also, the planarization layer 2213 may be formed as a multilayer structure in which layers of the organic insulating material and the inorganic insulating material are alternately stacked.

The intermediate layer 2214 may be formed on the entire planarization layer 2213 regardless of a position of the pixel. In this case, the organic emission layer, for example, may be formed by vertically stacking or mixing layers including light-emitting materials that emit red, green, and blue light. If the organic emission layer emits white light, the combination of different colors may be possible. The organic emission layer may be formed of a low molecular weight organic material or a polymer organic material.

The filler 2400 is included between the porous second electrode 2215 and the second substrate 2300. Since the filler 2400 is included between the porous second electrode 2215 and the second substrate 2300, the structure of the organic light-emitting display apparatus 2000 may be maintained, and the delamination or cell breakage phenomenon due to external impacts may be prevented.

The color filter 2800 may be disposed under the second substrate 2300, and the overcoat layer 2850 may be formed to cover the color filter 2800. The overcoat layer 2850 may protect the color filter 2800 and may planarize a surface of a layer in which the color filter 2800 is formed. An organic insulating layer may be used as the overcoat layer 2850. The organic insulating layer may include a general purpose polymer (e.g., poly(methyl methacrylate) (PMMA), or polystyrene (PS)), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, or a blend thereof. Also, a material having a high transmittance may be used in consideration of luminous efficiency.

Since the overcoat layer 2850 may include an organic material, outgas may be released from the overcoat layer 2850. Herein, the outgas denotes a source gas that is diffused from the overcoat layer 2850.

The porous separation layer 2700 may be disposed between the filler 2400 and the porous second electrode 2215. In a case where the filler 2400 is directly in contact with the porous second electrode 2215, external impacts may be directly applied to the porous second electrode 2215. Thus, this may be a cause of progressive dark spots, or the porous second electrode 2215 may be detached. Also, in the case where the filler 2400 is directly in contact with the porous second electrode 2215, a chemical reaction between the filler 2400 and the porous second electrode 2215 may occur. Therefore, the porous separation layer 2700, which may act as a sacrificial layer, is disposed between the filler 2400 and the porous second electrode 2215. Thus, limitations that may occur due to the direct contact between the filler 2400 and the porous second electrode 2215 may be prevented. Also, in the case where the organic light-emitting display apparatus 1000 is a top-emission type, the porous separation layer 2700 may assist the emission of light generated by the OLED2, in addition to separating the filler 2400 and the porous second electrode 2215.

The porous separation layer 2700 may include an organic material or LiF. The porous separation layer 2700 may be formed of an organic material, such as α-NPD, NPB, TPD, m-MTDATA, Alq3, or CuPc.

The porous separation layer 2700 has a porous structure. Pores of the porous separation layer 2700 may prevent a localized concentration of impurities in the porous separation layer 2700. The impurities may be, for example, moisture and/or oxygen derived from the color filter 2800, the overcoat layer 2850, or the filler 2400 and may affect the organic emission layer. Thus, the porous separation layer 2700 may delay the occurrence of dark spots that are generated due to the concentration of the impurities.

In the case where the organic light-emitting display apparatus 2000 is a top-emission type, a porous high refractive index layer (not shown), which may assist the emission of light generated by the OLED2, may be disposed between the porous separation layer 2700 and the porous second electrode 2215.

Referring FIG. 8, the first electrode 2211, the intermediate layer 2214, the porous second electrode 2215, the porous separation layer 2700, the filler 2400, the overcoat layer 2850, the color filter 2800, and the second substrate 2300 are sequentially formed. A black matrix 2870 is formed by being divided into a light transmission area and a light blocking area under the second substrate 2300. Since the black matrix 2870 is formed between the color filters 2800, areas having the black matrix 2870 formed therein may block light. The porous second electrode 2215 may be formed by sputtering, ALD, or CVD.

In the case where the organic light-emitting display apparatus 2000 is a top-emission type, the porous second electrode 2215 may be naturally porous, by forming a metal layer having a thickness of about 1 Å to about 200 Å. A method of forming the porous second electrode 2215 is not limited thereto, and the porous second electrode 2215 may be formed by various methods in consideration of forming conditions.

Since the color filter 2800 may include an organic material, impurities may be generated by the color filter 2800. Specifically, outgas G21 may be released from the color filter 2800. Herein, the outgas denotes a source gas that is diffused from the color filter 2800. Since the porous second electrode 2215 has a porous structure, the outgas G21 derived from the color filter 2800 may not be locally concentrated therein, i.e., the outgas G21 may uniformly diffuse through the porous second electrode 2215 via the pores thereof. Since the localized concentration of the material damaging the porous second electrode 2215 or the intermediate layer 2214, such as the outgas G21 derived from the color filter 2800, may be prevented by an average effect, a local damage to the porous second electrode 2215 or the intermediate layer 2214 may be suppressed as much as possible. Thus, the manifestation of dark spots may be delayed. Herein, the expression "average effect" denotes an effect in which an outgas material is not concentrated on a portion but overall diffuses. When a dense electrode, is used as a second electrode, the outgas material diffuses through defects of the dense second electrode, i.e., pinholes generated by foreign matter or scratches. Thus, the outgas material may be concentrated on the defects.

As a result, an intermediate layer between the first electrode and the second electrode is damaged at the defects to generate dark spots, and progressive dark spots may occur, in which the dark spots continuously grow. Since the porous electrode is used as the second electrode, the outgas material may not be locally concentrated on the defects but may uniformly diffuse due to the average effect. Thus, the progressive dark spots may not be generated. As a result, the lifetime of the organic light-emitting display apparatus 2000 may be extended to improve the reliability of the product.

Since the overcoat layer 2850 may include an organic material, impurities may be generated from the overcoat layer 2850. Specifically, outgas G22 may be released from the overcoat layer 2850. Herein, the outgas denotes a source gas that is diffused from the overcoat layer 2850. Since the porous second electrode 2215 has a porous structure, the outgas G22 may not be locally concentrated therein. Since the localized concentration of the outgas G22 d may be prevented by an average effect, a local damage to the porous second electrode 2215 or the intermediate layer 2214 may be suppressed as much as possible. Thus, the manifestation of dark spots may be delayed. As a result, the lifetime of the organic light-emitting display apparatus 2000 may be extended to improve the reliability of the product.

Since the filler 2400 may include an organic material, impurities may be generated from the filler 2400. Specifically, outgas G23 may be released from the filler 2400. Herein, the outgas denotes a source that is diffused from the filler 2400. Since the porous second electrode 2215 has a porous structure the outgas G23 derived from the filler 2400 may not be locally concentrated therein. Since the localized concentration of the outgas G23 may be prevented by an average effect, local damage to the porous second electrode 2215 or the intermediate layer 2214 may be suppressed as much as possible. Thus, the manifestation of dark spots may be delayed. As a result, the lifetime of the organic light-emitting display apparatus 2000 may be extended to improve the reliability of the product.

In order for the impurities, such as the outgases G21, G22, and G23, not to be locally concentrated in the porous second electrode 2215, the pore diameter of the porous second electrode 2215 may be formed to be about 3 Å or more. Since the diameter of a water molecule ($H_2O$) is about 2.65 Å, and the diameter of an oxygen molecule ($O_2$) is about 3 Å, the pore diameter of the porous second electrode 2215 is generally formed to be about 3 Å or more. Thus, the localized concentration of the impurities may be prevented, to delay the occurrence of dark spots that are generated due to the concentration of the impurities.

The porous separation layer 2700 may be disposed between the filler 2400 and the porous second electrode 2215. Since the porous separation layer 2700 has a porous structure, the outgases G21, G22, and G23 may diffuse throughout the porous separation layer 2700 without being locally concentrated. In order for the impurities not to be locally concentrated in the porous separation layer 2700, other additional layers disposed between the filler 2400 and the porous second electrode 2215 may also be porous.

As described above, according to the one or more of the above embodiments of the present invention, the lifetime of an organic light-emitting display apparatus may be improved by delaying the manifestation of progressive dark spots.

The present invention is not limited to the configuration and method of the above-described embodiments, but may be variously modified by selectively combining the entirety or a portion of each embodiment.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting display apparatus comprising:
    a first substrate;
    a display unit disposed on the first substrate and comprising organic light-emitting devices;
    a second substrate facing the display unit; and
    a color filter disposed on the second substrate,
    wherein:
    the organic light-emitting devices each comprises:
        a first electrode disposed on the first substrate;
        an intermediate layer disposed on the first electrode and comprising an organic emission layer;
        a porous second electrode disposed on the intermediate layer;
        a filler comprising an organic material disposed between the first substrate and the second substrate; and
        a porous separation layer disposed between the porous second electrode and the filler;
    the filler directly contacts the porous separation layer; and
    the porous separation layer comprises an organic material.

2. The organic light-emitting display apparatus of claim 1, further comprising an overcoat layer disposed on the color filter.

3. The organic light-emitting display apparatus of claim 1, further comprising a black matrix disposed on the second substrate.

4. The organic light-emitting display apparatus of claim 1, wherein the filler comprises silicon, an acryl-based resin, an epoxy-based resin, a urethane-based resin, or a mixture thereof.

5. The organic light-emitting display apparatus of claim 1, wherein the filler comprises a getter material.

6. The organic light-emitting display apparatus of claim 1, wherein the filler completely fills a space between the display unit and the second substrate.

7. The organic light-emitting display apparatus of claim 6, wherein the filler covers the display unit and contacts the first substrate.

8. The organic light-emitting display apparatus of claim 1, further comprising a sealant bonding the first substrate and the second substrate.

9. The organic light-emitting display apparatus of claim 8, wherein the sealant comprises a glass frit.

10. The organic light-emitting display apparatus of claim 8, further comprising a getter disposed between the sealant and the display unit.

11. The organic light-emitting display apparatus of claim 1, wherein the impurities comprise an outgas generated by the color filter.

12. The organic light-emitting display apparatus of claim 1, wherein the porous second electrode comprises lithium (Li), calcium (Ca), LiF/Ca, LiF/Al, aluminum (Al), silver (Ag), magnesium (Mg), ytterbium (Yb), or a combination thereof.

13. The organic light-emitting display apparatus of claim 1, wherein a pore diameter of the porous second electrode is about 3 Å.

14. The organic light-emitting display apparatus of claim 1, wherein a thickness of the porous second electrode is in a range of about 1 Å to about 200 Å.

15. A method of manufacturing an organic light-emitting display apparatus, the method comprising:
    forming a display unit on a first substrate;
    disposing a filler on the display unit; and
    disposing a second substrate on the filler,
    wherein:
    the forming of the display unit on the first substrate comprises:
        forming a first electrode on the first substrate;
        forming an organic emission layer on the first electrode; and
        forming a porous second electrode on the organic emission layer;
    the method further comprises:
        forming a porous separation layer between the porous second electrode and the filler;
        and
        forming a sealant between the first substrate and the second substrate bonding the first substrate and the second substrate, the sealant surrounding the display unit and the filler and having a predetermined spacing from the display unit;
    the filler covers the porous second electrode, a side of the porous separation layer, and a top of the porous separation layer;
    the filler is formed so as not to extend beyond the sealant;
    the filler comprises an organic material and the organic material directly contacts the porous separation layer; and
    the porous separation layer comprises an organic material.

* * * * *